(12) United States Patent
Ramaswamy et al.

(10) Patent No.: US 10,923,651 B2
(45) Date of Patent: Feb. 16, 2021

(54) SPIN ORBIT MATERIALS FOR EFFICIENT SPIN CURRENT GENERATION

(71) Applicant: National University of Singapore, Singapore (SG)

(72) Inventors: Rajagopalan Ramaswamy, Singapore (SG); Yi Wang, Singapore (SG); Shuyuan Shi, Singapore (SG); Hyunsoo Yang, Singapore (SG)

(73) Assignee: National University of Singapore, Singapore (SG)

( * ) Notice: Subject to any disclaimer, the term of this patent is extended or adjusted under 35 U.S.C. 154(b) by 184 days.

(21) Appl. No.: 16/104,013

(22) Filed: Aug. 16, 2018

(65) Prior Publication Data
US 2019/0058113 A1 Feb. 21, 2019

(30) Foreign Application Priority Data
Aug. 16, 2017 (SG) .............. 10201706699P

(51) Int. Cl.
*G11C 11/16* (2006.01)
*H01L 43/10* (2006.01)
(Continued)

(52) U.S. Cl.
CPC ............ *H01L 43/10* (2013.01); *G11C 11/161* (2013.01); *G11C 11/1675* (2013.01);
(Continued)

(58) Field of Classification Search
CPC ... G11C 11/161; G11C 11/1675; G11C 11/18; G11C 11/1659; G11C 11/1673;
(Continued)

(56) References Cited

U.S. PATENT DOCUMENTS 9,542,987 B2  1/2017  Naik et al.
10,490,249 B2 *  11/2019  Sasaki .................. H01L 22/14
(Continued)

FOREIGN PATENT DOCUMENTS

CN        104775049 A       7/2015
WO    WO-2017/034563 A1    3/2017

OTHER PUBLICATIONS

McGill, Erica, "Globalfoundries Launches Embedded MRAM on 22FDX® Platform," Globalfoundries Sep. 15, 2016, pp. 1-3.
(Continued)

*Primary Examiner* — Hien N Nguyen
(74) *Attorney, Agent, or Firm* — Cesari and McKenna, LLP; James A. Blanchette

(57) ABSTRACT

In one embodiment, a SOT device is provided that replaces a traditional NM layer adjacent to a magnetic layer with a NM layer that is compatible with CMOS technology. The NM layer may include a CMOS-compatible composite (e.g., CuPt) alloy, a TI (e.g., $Bi_2Se_3$, $Bi_xSe_{1-x}$, $Bi_{1-x}Sb_x$, etc.) or a TI/non-magnetic metal (e.g., $Bi_2Se_3$/Ag, $Bi_xSe_{1-x}$/Ag, $Bi_{1-x}Sb_x$/Ag, etc.) interface, that provides efficient spin current generation. Spin current may be generated in various manners, including extrinsic SHE, TSS or Rashba effect.

8 Claims, 21 Drawing Sheets

(51) Int. Cl.
*H01L 43/06* (2006.01)
*H01L 27/22* (2006.01)
*G11C 19/08* (2006.01)
*H03K 19/18* (2006.01)
*H01L 43/04* (2006.01)
*G11C 11/18* (2006.01)

(52) U.S. Cl.
CPC .......... *G11C 11/18* (2013.01); *G11C 19/0841* (2013.01); *H01L 27/222* (2013.01); *H01L 43/04* (2013.01); *H01L 43/065* (2013.01); *H03K 19/18* (2013.01)

(58) Field of Classification Search
CPC ....... H01L 43/08; H01L 43/04; H01L 27/222; H01L 43/06; H01L 27/228; H01L 21/8239; H01L 27/226
See application file for complete search history.

(56) References Cited

U.S. PATENT DOCUMENTS

| | | |
|---|---|---|
| 2016/0351696 A1 | 12/2016 | Habib et al. |
| 2017/0077392 A1 | 3/2017 | Han et al. |
| 2018/0301266 A1* | 10/2018 | Ou .................. H03B 15/006 |
| 2019/0147929 A1* | 5/2019 | Sasaki ................ H01L 43/02 365/158 |
| 2019/0189516 A1* | 6/2019 | Sasaki .................. H01L 29/82 |
| 2019/0221733 A1* | 7/2019 | Sasaki ................ G11C 11/161 |
| 2019/0312198 A1* | 10/2019 | Sun ..................... H01L 43/12 |

OTHER PUBLICATIONS

Mertens, Ron, "Samsung Foundry to start offering STT-MRAM by 2019," MRAM-Ingo, Metalgrass Software, Sep. 23, 2016, pp. 1-3.

* cited by examiner

FIGS. 9A-J
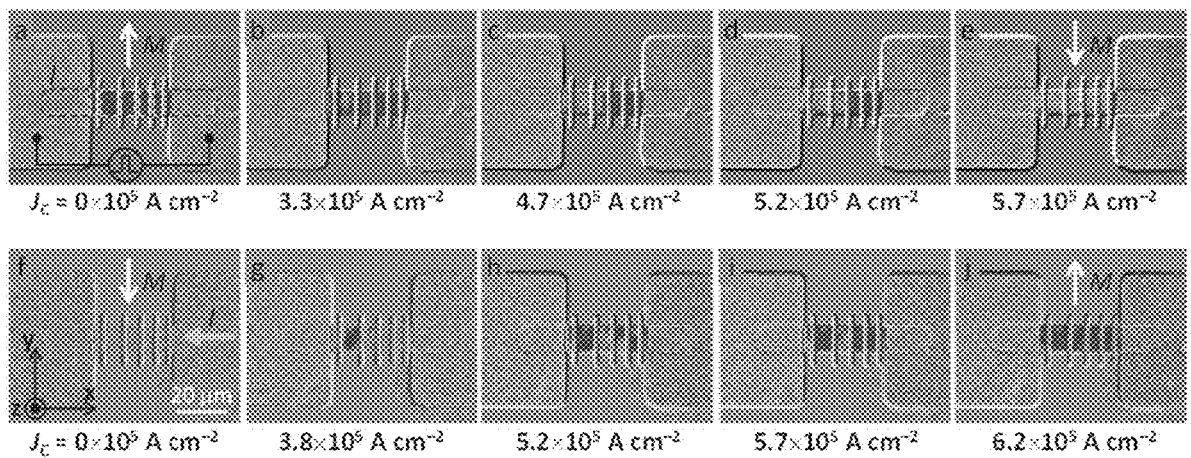

$j_C = 0 \times 10^5 \text{A/cm}^2$ $J_C = 0 \times 10^5 \text{A/cm}^2$ $5.8 \times 10^5 A/cm^2$

SPIN ORBIT MATERIALS FOR EFFICIENT SPIN CURRENT GENERATION

RELATED APPLICATIONS

The present application claims priority to Singapore Patent Application No. 10201706699P, titled "Spin Orbit Materials for Efficient Spin Current Generation," filed by Applicant National University of Singapore on Aug. 16, 2017, the contents of which are incorporated by reference herein in their entirety.

BACKGROUND

Technical Field

The present disclosure relates generally to spin torque devices and more specifically to a spin-orbit torque (SOT) based magnetic devices ("SOT devices") and materials that may enable efficient spin current generation therein.

Background Information

Spin torque devices, such as spin torque magnetic random access memory (MRAMs), magnetic logic devices, racetrack memories, etc., manipulate magnetization directions to store information or for other purposes. Magnetization direction may be manipulated using current-induced STT. STT techniques have advanced over a number of years, and STT MRAMs is becoming commercially available. Magnetization manipulation may also be achieved via current-induced SOT. A typical SOT device is structured as a device stack having a number of layers all arranged substantially parallel to a plane. For instance, a SOT device stack may include a magnetic layer (e.g., a ferromagnet (FM) layer) adjacent a non-magnetic layer (NM) layer. When an in-plane input current is applied to the SOT device, a spin current from the NM layer diffuses into the magnetic layer (e.g. FM layer) and influences the magnetization direction. While not yet at the point of commercial viability, SOT MRAM may represent the future of MRAM.

A basic requirement for manipulating the magnetization direction of a magnetic layer, such as a FM layer, is efficiently generating the spin current. In one technique, spin orbit coupling (SOC) effects in the NM are utilized to generate the spin currents electrically. One such effect is the spin Hall effect (SHE), which exploits SOC in the bulk of a NM, resulting in asymmetric scattering of opposite spins, and thus converting an unpolarized charge current into a pure spin current and vice-versa. FIG. 1 is a diagram 100 illustrating SHE inside of a NM 130 of a typical SOT device, with non-equilibrium spins 120 exerting SOT on a FM 110. The mechanism of SHE eliminates the need for a ferromagnetic spin polarizer or an external magnetic field to electrically generate spin currents. The spin current generation efficiency of a material by SHE is quantified by the spin Hall angle ($\theta_{SH}$). It is desirable to have a large $\theta_{SH}$ for constructing efficient SOT devices.

Since the origins of the SHE lie in SOC, and the strength of SOC is larger for heavier elements, heavy metals (HMs) such as platinum (Pt), tantalum (Ta), hafnium (Hf) and tungsten (W) typically have been utilized as the NM layer of the device stack in SOT devices. As such, the NM layer has often been referred to as a HM layer. The SHE in HMs arises from an intrinsic SHE mechanism, which results from the effects of SOC on the electronic band structure. However, common complementary metal oxide semiconductor (CMOS) technology does not use HMs such as Pt, Ta, Hf and W. Instead, the commonly used metals are copper (Cu) and aluminum (Al), which intrinsically have a very small $\theta_{SH}$. As such, it has proved problematic to integrate SOT devices with CMOS technology.

Further, current density ($J_C$) desired for SOT induced magnetization switching using HMs (such as Pt, Ta etc.) is high, e.g., in the order of approximately $10^7$-$10^8$ A/cm$^2$, which hinders SOT based applications. The high value of $J_C$ causes high power consumption and necessitates a large current driving transistor. Accordingly, there is a need for a way to mitigate the issue of high $J_C$.

In general, there is a need for a new spin current source to excite magnetization dynamics in SOT devices, to replace bulk spin current sources such as heavy metals.

SUMMARY

An improved SOT device (e.g., a SOT-based MRAM, logic device, racetrack memory, etc.) is provided that replaces a traditional NM layer adjacent to a magnetic layer with a NM layer that includes one of three classes of materials, namely an CMOS-compatible composite (e.g., copper platinum (CuPt)) alloy, a topological insulator (TI) (e.g., bismuth selenide ($Bi_2Se_3$), bismuth selenium ($Bi_xSe_{1-x}$) alloy, bismuth antimony ($Bi_{1-x}Sb_x$) alloy, etc.) or a TI/non-magnetic metal interface (e.g., a $Bi_2Se_3$/silver (Ag), $Bi_xSe_{1-x}$/Ag, $Bi_{1-x}Sb_x$/Ag, etc.) interface, that provide efficient current generation.

In a first embodiment, a SOT device replaces a traditional NM layer adjacent to a magnetic layer with a CMOS-compatible alloy NM layer, made by adding nonmagnetic impurities with strong SOC (e.g., Pt) to a light metal host (e.g., Cu) that is compatible with CMOS technology. The resulting alloy, due to its impurities with strong SOC (e.g., Pt), may provide a large SHA comparable to that of a pure heavy metal (e.g., pure Pt), and by selecting a light metal host that is a widely utilized metallization element in CMOS technology (e.g., Cu) may be readily integrated into CMOS processes. The alloy may provide extrinsic SHE mechanisms that rely upon election scattering on the impurity centers, namely skew scattering and side-jump scattering. Such extrinsic SHE mechanisms may allow $\theta_{SH}$ to advantageously be tuned by changing relative concentrations of the light metal host and strong SOC impurities. Further, the alloy may advantageously sustain high CMOS backend annealing temperatures.

In a second embodiment, a SOT device stack replaces a traditional NM layer adjacent to a magnetic layer with a topological insulator (TI) (e.g., $Bi_2Se_3$, $Bi_xSe_{1-x}$, $Bi_{1-x}Sb_x$, etc.) NM layer. TIs are an emerging state of quantum matter with strong spin-orbit coupling and excellent charge-to-spin conversion. A large SOT can be generated using a TI (e.g., $Bi_2Se_3$) by exploiting topological protected spin-momentum-locked surface states (TSS). Such large SOT may efficiently manipulate the adjacent magnetic layer and provide magnetization switching at extremely low $J_C$ in the absence of an assistive magnetic field. Low $J_C$ can enable SOT devices that have very low power consumption, allowing for small current driving transistors, and addressing other outstanding scalability issues. The absence of an assistive magnetic field further may allow for integration into well-established technologies for magnetic devices.

In a third embodiment, a SOT device stack replaces a traditional NM layer adjacent to a magnetic layer with a TI/non-magnetic metal interface (e.g., a $Bi_2Se_3$/Ag, $Bi_xSe_{1-x}$/Ag, $Bi_{1-x}Sb_x$/Ag, etc. interface) NM layer. This 2D interface may serve as a spin current source to excite magnetization dynamics and/or drive magnetization switching, replacing bulk spin current sources such as heavy metals.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which:

FIGS. 9A-J are a series of magneto-optic Kerr effect (MOKE) images for SOT driven magnetization switching in an example TI/FM device;

DETAILED DESCRIPTION OF EXAMPLE EMBODIMENTS

I. A SOT Device Stack

Figure 1:
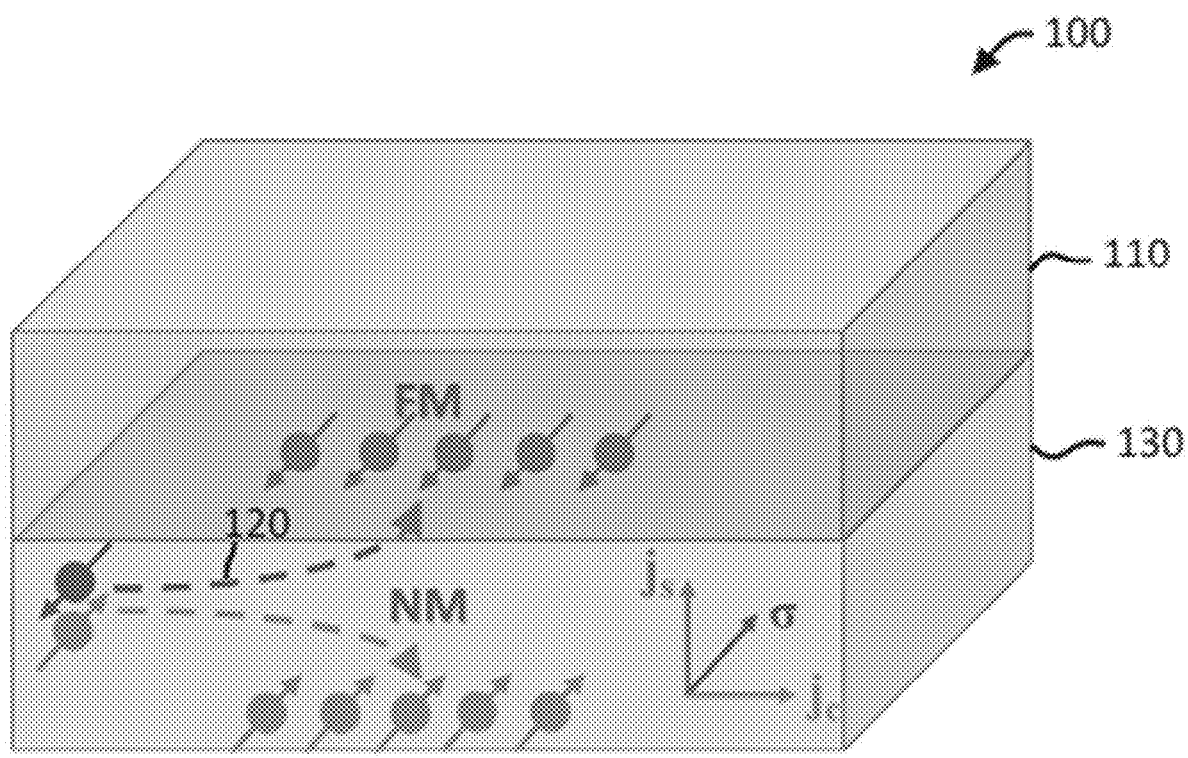
FIG. 1 is a diagram illustrating SHE inside of a NM of a typical SOT device, with non-equilibrium spins exerting SOT on a FM.
Figure 2:
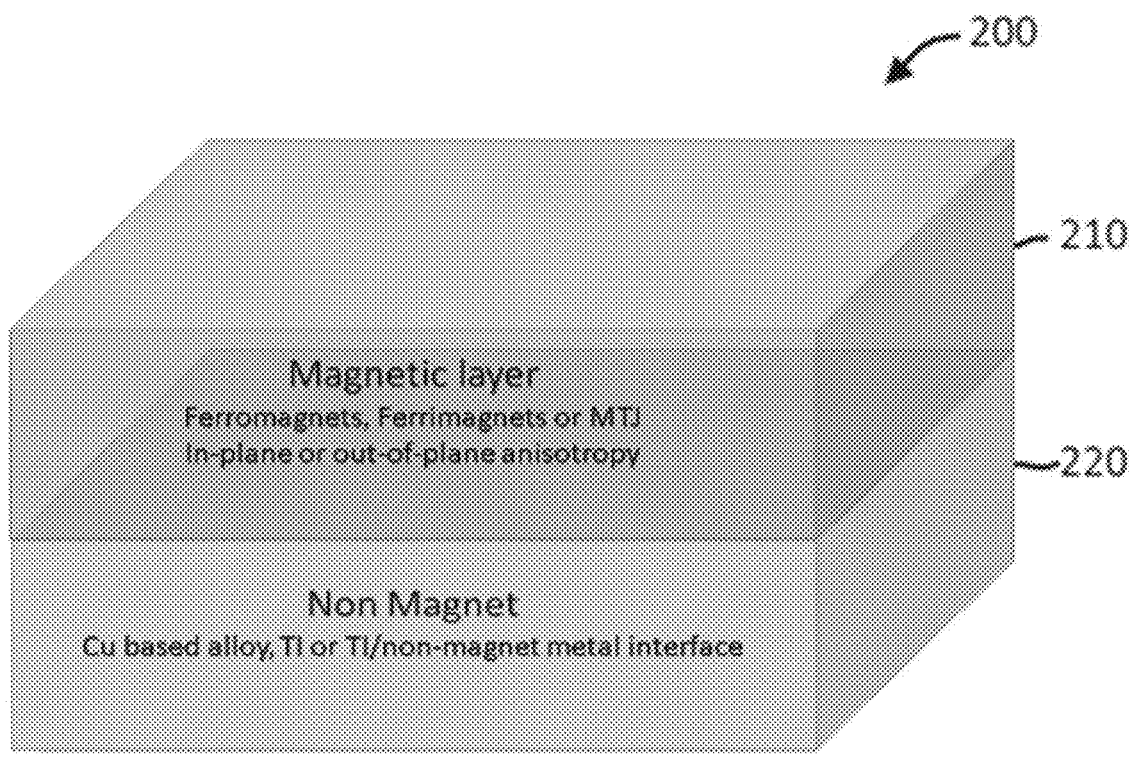
FIG. 2 is a diagram of an example SOT device (e.g., a SOT-based MRAM, logic device, racetrack memory, etc.) with a NM layer made of a CMOS-compatible composite alloy, a TI or a TI/non-magnetic metal interface adjacent to a magnetic layer.

FIG. 2 is a diagram of an example SOT device 200 (e.g., a SOT-based MRAM, logic device, racetrack memory, etc.) with a NM layer 220 made of a CMOS-compatible composite alloy, a TI, or a TI/non-magnetic metal interface, adjacent to a magnetic layer 210. While not shown, it should be understood that the example SOT device 200 may also include a plurality of other layers, for example, a barrier layer, a capping layer, etc. all disposed upon a substrate. Each of the layers may be made from any of a variety of different materials. For example, while it is discussed herein that when the NM layer 220 is a CMOS-compatible composite alloy it may be made from CuPt, it should be understood that it may alternatively be made from any of a class of Cu based alloys that provide enhanced SHE and CMOS compatibility. Further, while it is discussed herein that when the NM layer 220 is a TI it may be made from $Bi_2Se_3$, $Bi_xSe_{1-x}$, or $Bi_{1-x}Sb_x$, it should be understood that it may alternatively be made from any of a class of TIs that can efficiently switch an adjacent magnetic layer with large SOT. Likewise, while it is discussed herein that when the NM layer 220 is a TI/non-magnetic metal interface it may be made from $Bi_2Se_3$/Ag, $Bi_xSe_{1-x}$/Ag, or $Bi_{1-x}Sb_x$/Ag it should be understood that it may alternatively be made from any of the class of TI/non-magnetic metal interfaces with strong Rashba coupling.

Similarly, the other layers of the SOT device 200 may be made from various materials. The magnetic layer 210 may be a FM layer made from ferromagnetic materials such as iron (Fe), cobalt (Co), nickel (Ni) and their alloys (e.g., nickel iron (NiFe) alloy, cobalt iron boron (CoFeB) alloy, etc.); ferrimagnetic materials such as cobalt palladium (CoPd) alloy, cobalt terbium (CoTb), and cobalt gadolinium (CoGd) alloy, or multilayers such as $[Co/Tb]_n$, $[Co/Pd]_n$ and $[Co/Gd]_n$; or ferromagnetic or ferromagnetic insulators, such as yttrium iron garnet (YIG). A barrier layer (not shown) may be made from materials such as magnesium oxide (MgO), hafnium oxide (HfO) or other insulating materials or nonmagnetic metals. Likewise, the capping layer may be made from silicon oxide ($SiO_2$), aluminum oxide ($Al_2O_3$), etc.

II. A CMOS Compatible Composite Alloy NM Layer

A. Overview

In a first embodiment, a SOT device replaces a traditional NM layer with a CMOS-compatible composite alloy (e.g., a Cu-based alloy such as CuPt alloy) NM layer that provides an extrinsic SHE mechanism. For example, in this embodiment, a SOT device may be structured as a stack that includes a substrate made of silicon (Si), a FM layer of permalloy (Py) ($Ni_{81}Fe_{19}$) (e.g., having a thickness of 5 nanometers (nm)), a CMOS compatible composite alloy NM layer made of $Cu_{1-x}Pt_x$ (e.g., having a thickness of 6 nm) where x (0-100%) is the atomic ratio of Pt in $Cu_{1-x}Pt_x$ alloy, a barrier layer of MgO (e.g., having a thickness of 1 nm), and a capping layer of $SiO_2$ (e.g., having a thickness of 3 nm). The entire film stack may be deposited onto a thermally oxidized Si substrate at room temperature using magnetron sputtering. The composite alloy of $Cu_{1-x}Pt_x$ may be deposited by co-sputtering Cu and Pt targets. In order to tune the Pt concentration (x) in the $Cu_{1-x}Pt_x$ alloy, the sputtering power of Cu may be fixed and the sputtering power of Pt may be varied for x less than a threshold amount and the sputtering power of Pt may be fixed and the sputtering power of Cu may be varied for x greater than the threshold amount. The deposited films may be patterned using optical photolithography and argon (Ar) ion milling, among other processes.

B. An Example Test Device

In a specific test device for which experimental results are presented herein, the stack is deposited at room temperature using magnetron sputtering with a base pressure of $<2\times10^{-9}$ Torr. To tune the Pt concentration (x) in the $Cu_{1-x}Pt_x$ alloy, the sputtering power of Cu is fixed at 120 W and the sputtering power of Pt is varied from 0 to 150 W for x less than 75%, and the sputtering power of Pt is fixed at 60 W and the sputtering power of Cu is varied between 0 and 60 W for x greater than 75%. The deposited films are patterned into rectangular microstrips having a length of 130 μm and a width of 20 μm using optical photolithography and Ar ion milling. A coplanar waveguide (CPW) is fabricated using optical photolithography and sputter deposition to make electrical contacts with the microstrips. A gap (G) between ground and signal electrodes of the CPW is varied in the range 35-90 μm among the different devices in order to tune the device impedance close to ~50Ω.

Figure 3A:
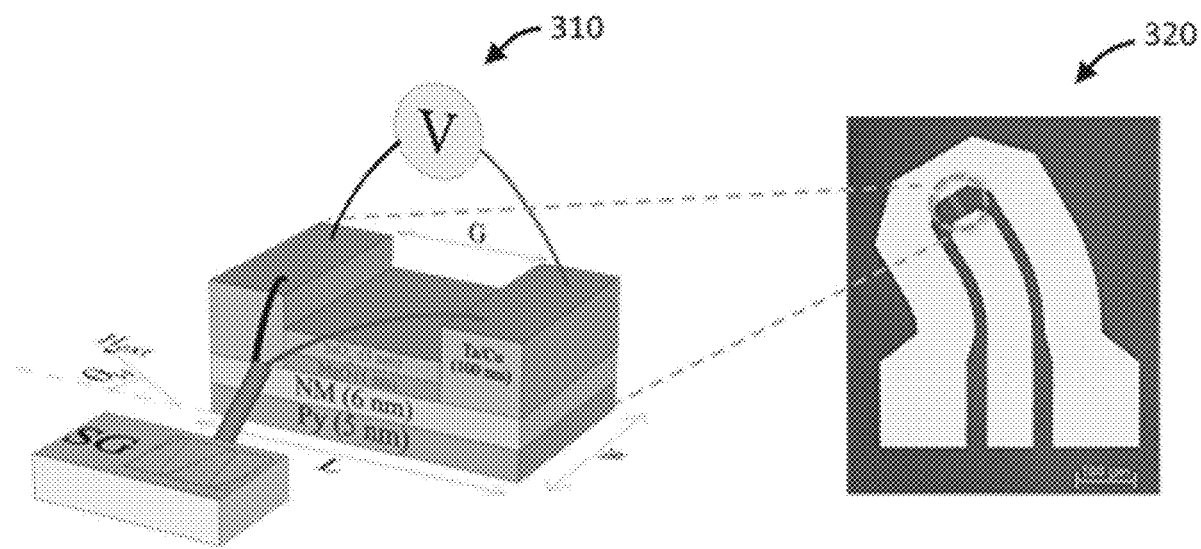
FIG. 3A is a diagram of an example device with a measurement configuration for spin torque ferromagnetic resonance (ST-FMR) together with an optical microscope image of a corresponding section of the device.

FIG. 3A is a diagram 310 of an example device with a measurement configuration for spin torque ferromagnetic resonance (ST-FMR) together with an optical microscope image 320 of a corresponding section of the device. The circle and dotted lines indicate the correspondence between the section in the optical microscope image 320 and a region in the diagram 310. In this example test, the ST-FMR measurements are carried out at room temperature.

For the ST-FMR measurements, a microwave current of a fixed frequency (f=7, 8, or 9 GHz) is applied to $Py/Cu_{1-x}Pt_x$ bilayer. Simultaneously, an external magnetic field $H_{ext}$ is applied at an angle $\theta_H=35°$ with respect to the current channel, as shown in FIG. 3A. Due to the principle of SHE, the oscillating charge current in the non-magnetic $Cu_{1-x}Pt_x$ alloy is converted into a transverse oscillating spin current, which in turn exerts an oscillating spin Hall torque on the FM layer (here, the Py layer). The AC charge current in the $Cu_{1-x}Pt_x$ layer also generates an alternating Oersted field induced torque on the Py layer. These oscillating torques induce magnetization precession in the Py layer and the resistance of the bilayer oscillates due to the anisotropic magnetoresistance effect at the same frequency as the magnetization precession. Consequently, a DC mixing voltage $V_{mix}$ was produced by the product of applied alternating charge current and oscillating resistance. A nanovoltmeter is used to measure the $V_{mix}$ signal across the device. For a given frequency f of the microwave current, $H_{ext}$ is swept to meet the resonance condition given by the Kittel's relation. The ST-FMR spectrum is obtained by measuring $V_{mix}$ as a function of $H_{ext}$.

Figure 3B:
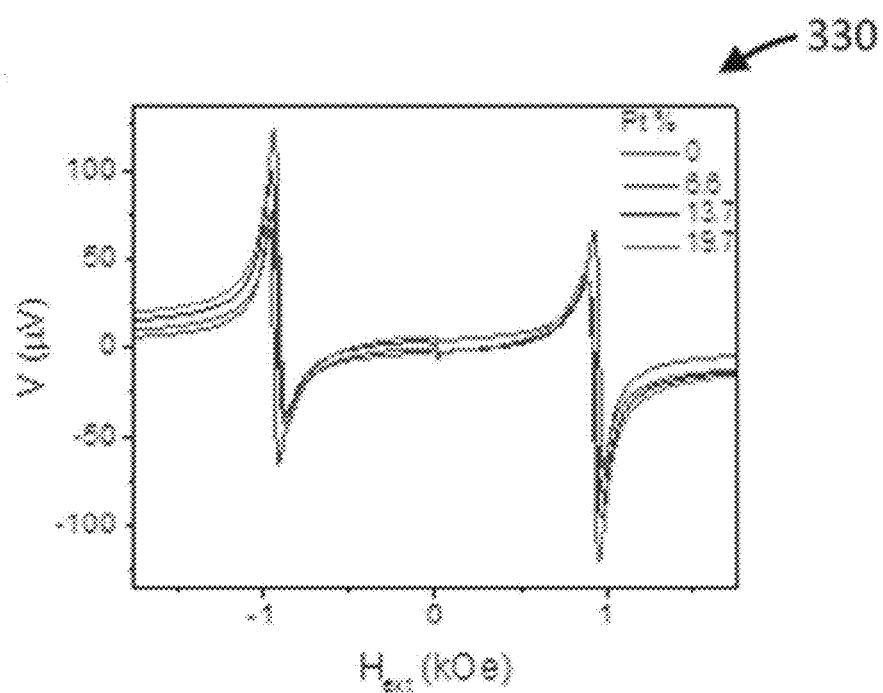
FIG. 3B is a representative ST-FMR spectra measured from the $Py/Cu_{1-x}Pt_x$ bilayer of the example device shown in FIG. 3A for x=0, 6.6, 13.7, and 19.7%.

FIG. 3B is a representative ST-FMR spectra 330 measured from the $Py/Cu_{1-x}Pt_x$ bilayer of the example device shown in FIG. 3A for x=0, 6.6, 13.7, and 19.7%. The spectra are as at a microwave frequency of 8 GHz and a nominal microwave power of 16 dBm.

C. Extraction of Spin Hall Angle and Damping

The ST-FMR spectra of FIG. 3B can be fitted using the equation:

$$V_{mix} = V_S F_S(H_{ext}) + V_A F_A(H_{ext}),$$

where $F_S(H_{ext})$ is a symmetric Lorentzian function of amplitude $V_S$ and $F_A(H_{ext})$ is an antisymmetric Lorentzian function of amplitude $V_A$. The Oersted field induced torque from the charge current in $Cu_{1-x}Pt_x$ layer is in out-of-phase with the magnetization precession and thus generates an antisymmetric Lorentzian spectrum about the resonance field, while the spin Hall torque from the generated spin current is in-phase with the magnetization precession and hence produces a symmetric Lorentzian spectrum about the resonance field.

$\theta_{SH}$ is the ratio of spin current density generated in the NM for a given charge current density. Therefore, $\theta_{SH}$ can be expressed to be proportional to the ratio $V_S/V_A$ according to the equation:

$$\theta_{SH}(V_S/V_A)(e\mu_0 M_S t d/\hbar)[1+(4\pi M_{eff}/H_{ext})]^{1/2},$$

where $M_S$ and $M_{eff}$ are the saturation and effective magnetization of the Py layer, respectively, and t and d are the thicknesses of the Py layer and the $Cu_{1-x}Pt_x$ alloy layer, respectively.

Figure 4A:
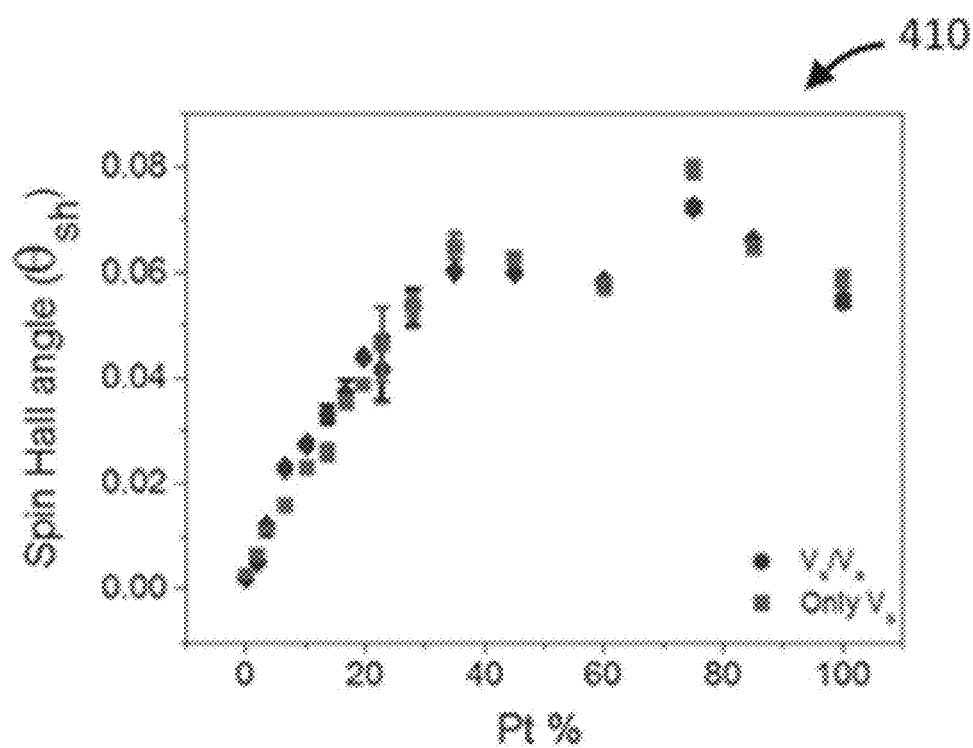
FIG. 4A is a plot of $\theta_{SH}$ for different Pt concentrations extracted from a $V_s/V_A$ ratio method (shown as circles) and an only $V_s$ method (squares) for the example device shown in FIG. 3A.

FIG. 4A is a plot 410 of $\theta_{SH}$ for different Pt concentrations extracted from a $V_S/V_A$ ratio method (shown as circles) and an only $V_S$ method (squares) for the example device shown in FIG. 3A. The values in the plot 410 are from ST-FMR data for three frequencies (7, 8, and 9 GHz). It can be seen from FIG. 4A that as the Pt concentration increases, the $\theta_{SH}$ of $Cu_{1-x}Pt_x$ monotonically increases until x is approximately equal to 33%. Furthermore, it can be seen that a $Cu_{1-x}Pt_x$ alloy with 28% Pt can give rise to a $\theta_{SH}$ of 0.054, which is comparable to $\theta_{SH}$ of 0.055 obtained from pure Pt.

The $V_S/V_A$ ratio method utilized to determine $\theta_{SH}$ values assumes that the interfacial effects such as the Rashba effect at a FM/NM interface (here the $Py/Cu_{1-x}Pt_x$ interface) is not significant. However, if the Rashba effect is significant, it can generate an effective field-like torque term of the same symmetry as Oersted field induced torque and thus can contribute to $V_A$. As a result, the value of $\theta_{SH}$ may not be accurately estimated from ST-FMR spectra. In order to eliminate such an issue, $\theta_{SH}$ can be determined by considering only the symmetric component $V_S$ of the ST-FMR spectrum using the equation $$\theta_{SH} = \frac{\sigma_{SHE}}{\sigma} = \frac{1}{\sigma}\left(\frac{4V_S M_S t \Delta}{E I_{rf} \gamma \cos\theta_H (dR/d\theta_H)}\right),$$

where $\Delta$ is the linewidth of the Lorentzian ST-FMR spectrum, E and $I_{rf}$ are the microwave electric field and current through the device, respectively, $dR/d\theta_H$ is angular dependent magnetoresistance of the device at $\theta_H=35°$, and $\alpha_{SHE}$ and $\sigma$ are the spin Hall and longitudinal charge conductivities of the $Cu_{1-x}Pt_x$ alloy, respectively. FIG. 4A also shows the values of $\theta_{SH}$ for different x extracted from only $V_S$. It can be seen that the extracted values of $\theta_{SH}$ from $V_S/V_A$ ratio and only $V_S$ are almost similar indicating that the Rashba effect induced field-like torque is negligible compared to the Oersted field induced torque.

Figure 4B:
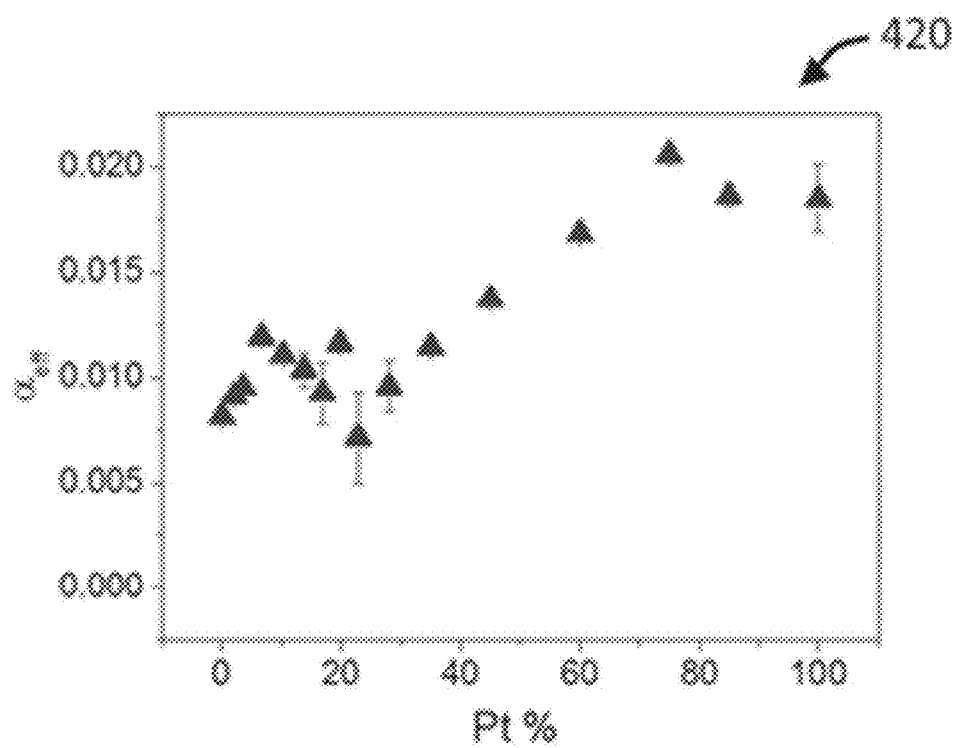
FIG. 4B is a plot of extracted effective Gilbert damping coefficient, $\alpha_{eff}$, for different Pt concentrations in the example device shown in FIG. 3A.

FIG. 4B is a plot 420 of extracted effective Gilbert damping coefficient, $\alpha_{eff}$ for different Pt concentrations in the example device shown in FIG. 3A. The Gilbert damping coefficient may be extracted using the relation, $\Delta=H_0+2\pi\alpha_{eff} f/\gamma$. In this example, it can be seen that in the Cu rich regime (x<33%) the extracted $\alpha_{eff}$ is around 0.01 which is approximately 2 times smaller than $\alpha_{eff}$ extracted from ST-FMR measurements in Py/Pt bilayer. Compared to the Py/Cu bilayer, the Py/Pt bilayer offers a larger Gilbert damping enhancement due to a larger spin mixing conductance and/or enhanced magnetic proximity effect. In the Cu rich regime, the interface between Py and $Cu_{1-x}Pt_x$ alloy should be dominated by Cu. Therefore, $Cu_{1-x}Pt_x$ alloy can be expected to offer a smaller $\alpha_{\mathit{eff}}$ in the Cu rich regime compared with Pt rich regime as observed in FIG. 4B. Thus, in addition to its significant $\theta_{SH}$ $Cu_{1-x}Pt_x$ alloy offers a smaller damping enhancement in the Py that makes it suitable for applications requiring a lower Gilbert damping.

Apart from large $\theta_{SH}$ and smaller damping enhancement, the $Cu_{1-x}Pt_x$ alloy exists as a single-phase solid solution for temperatures up to approximately 1000° C. due to high solubility of Pt in Cu. Therefore, the $Cu_{1-x}Pt_x$ alloy can sustain high CMOS backend processing temperatures (e.g., 400° C.).

D. Contributions of Skew Scattering and Side-Jump

In order to identify the contributions from skew scattering and side-jump to the extrinsic SHE, spin Hall resistivity induced by the Pt ($\rho_{SH}^{imp}$) is compared with the longitudinal resistivity induced by Pt ($\rho_{imp}$) for different Pt concentrations. Here, $\rho_{imp}$ is determined using the equation $\rho_{imp} = \rho_{CuPt} - \rho_{Cu}$, where $\rho_{CuPt}$ and $\rho_{Cu}$ are values of the longitudinal resistivity for $Cu_{1-x}Pt_x$ alloy and pure Cu, respectively, of thicknesses 6 nm. The longitudinal resistivity for 6 nm thick pure Cu and pure Pt are measured as 20.5 µΩcm and 32 µΩcm, respectively.

Figure 5A:
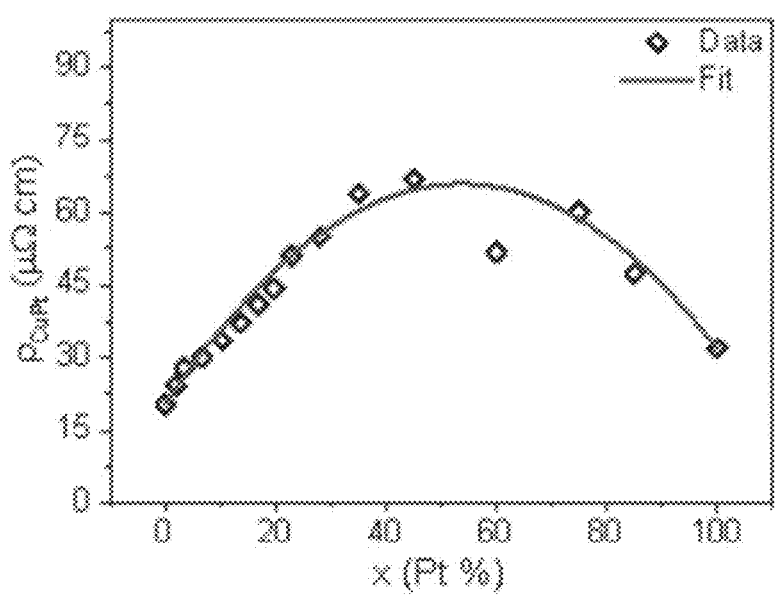
FIG. 5A is a plot of extracted $\rho_{imp}$ for different x in the example device shown in FIG. 3A.

FIG. 5A is a plot 510 of extracted $\rho_{imp}$ for different x in the example device shown in FIG. 3A. The dotted line in FIG. 5A indicates the region where $\rho_{imp}$ increases linearly with Pt concentration until x equals approximately 33% due to high solubility of Pt in Cu. Analysis here is restricted to the linear regime (x less than approximately 33%).

To determine $\rho_{SH}^{imp}$ for different x, the following equation may be used:

$$-\rho_{SH} = \sigma_{SH}^{int}\rho_{CuPt}^2 - \rho_{SH}^{imp},$$

where $\rho_{SH}$ is the spin Hall resistivity of $Cu_{1-x}Pt_x$ alloy determined from relation $\theta_{SH} = (-\rho_{SH}/\rho_{CuPt})$ and $\sigma_{SH}^{int}$ is the intrinsic contributions of Cu to the spin Hall resistivity. In the equation the contributions of phonons for the spin Hall resistivity are not considered as they are negligible. However, contributions of $\sigma_{SH}^{int}$ is considered due to a non-zero $\theta_{SH}$ in Cu, even though it is one order of magnitude smaller than that in $Cu_{1-x}Pt_x$ alloy. To determine $\sigma_{SH}^{int}$, consider the case x=0%, for which $\rho_{SH}^{imp}=0$ and $\rho_{CuPt}=\rho_{Cu}$, since $\rho_{imp}=0$. Hence, $\sigma_{SH}^{int}$ can be written as $\sigma_{SH}^{int}=-\rho_{SH}/\rho_{Cu}^2=\theta_{Sh,Cu}/\rho_{Cu}$, where $\theta_{SH,Cu}$ is the $\theta_{SH}$ of Cu (x=0%). Substituting the expressions for $\sigma_{SH}^{int}$ and $\rho_{SH}$ into the above equation one obtains the equation:

$$-\rho_{SH}^{imp} = \rho_{CuPt}\theta_{SH} - (\theta_{SH,Cu}/\rho_{Cu})\rho_{CuPt}^2.$$

Figure 5B:
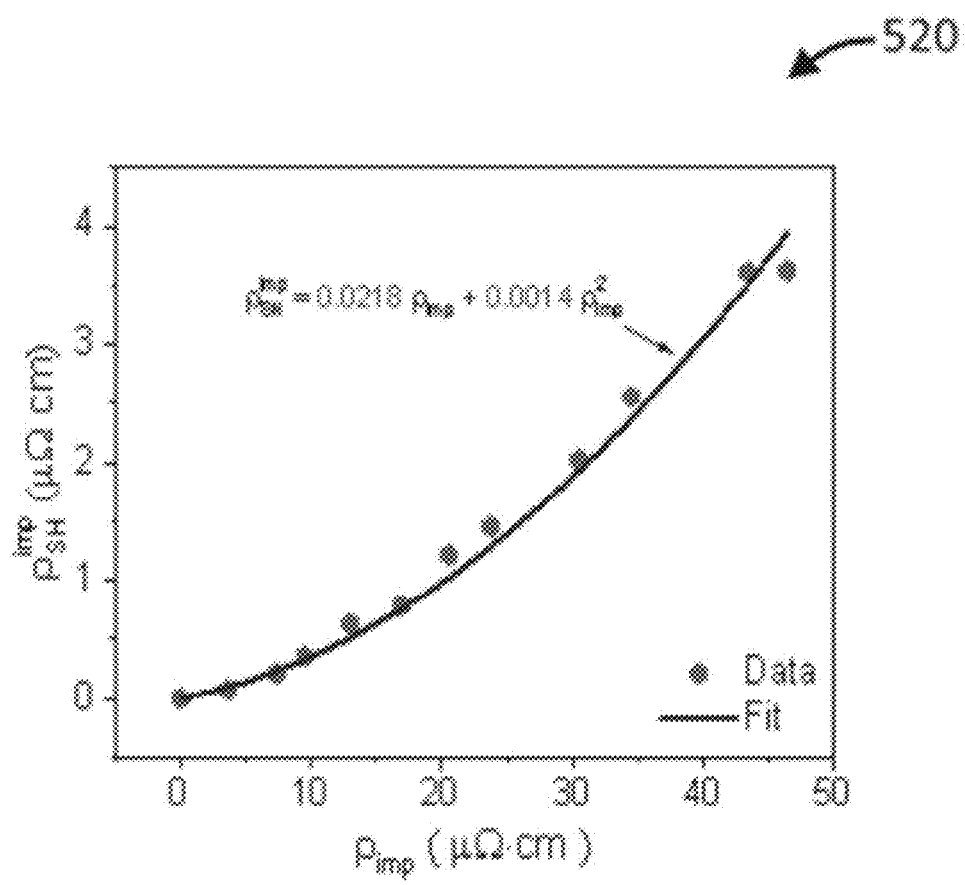
FIG. 5B is a plot of $|\rho_{SH}^{imp}|$ as a function of $\rho_{imp}$ in the example device shown in FIG. 3A.

FIG. 5B is a plot 520 of $|\rho_{SH}^{imp}|$ as a function of $\rho_{imp}$ in the example device shown in FIG. 3A. The data in FIG. 5B may be fit to the relation $|\rho SH^{imp}| = \theta_{SH}^{SS}\rho_{imp} + \sigma_{SH}^{SJ}\rho_{imp}^2$, where $\theta_{SH}^{SS}$ and $\sigma_{SH}^{SJ}$ are the contributions of skew scattering and side-jump to the extrinsic SHE induced by Pt. From the fitting, one may extract values: $\theta_{SH}^{SS}=0.022\pm0.005$ and $\sigma_{SH}^{SJ}=0.0015\pm0.0001$ µΩ$^{-1}$cm$^{-1}$. For these extracted values of the $\sigma_{SH}^{SS}$ and $\sigma_{SH}^{SJ}$, for $\rho_{imp}=\theta_{SH}^{SS}/\sigma_{SH}^{SJ}=14.7$ µΩcm, the contributions from skew scattering and side-jump to extrinsic SHE are equal. Therefore, the skew scattering dominates for $\rho_{imp}<14.7$ µΩcm, while the side-jump mechanism dominates for $\rho_{imp}>14.7$ µΩcm. From FIG. 5A, the value of $\rho_{imp}=14.7$ µΩcm corresponds to x being approximately equal to 11.5%. Therefore, one may observe that in the example device shown in FIG. 3A, for low Pt concentrations (e.g., less than 11.5%) the skew scattering contribution to extrinsic SHE is significant, while for higher Pt concentrations (e.g., greater than 11.5%) the side-jump contribution is significant.

E. Thickness Dependence and Spin Diffusion Length

Figure 6:
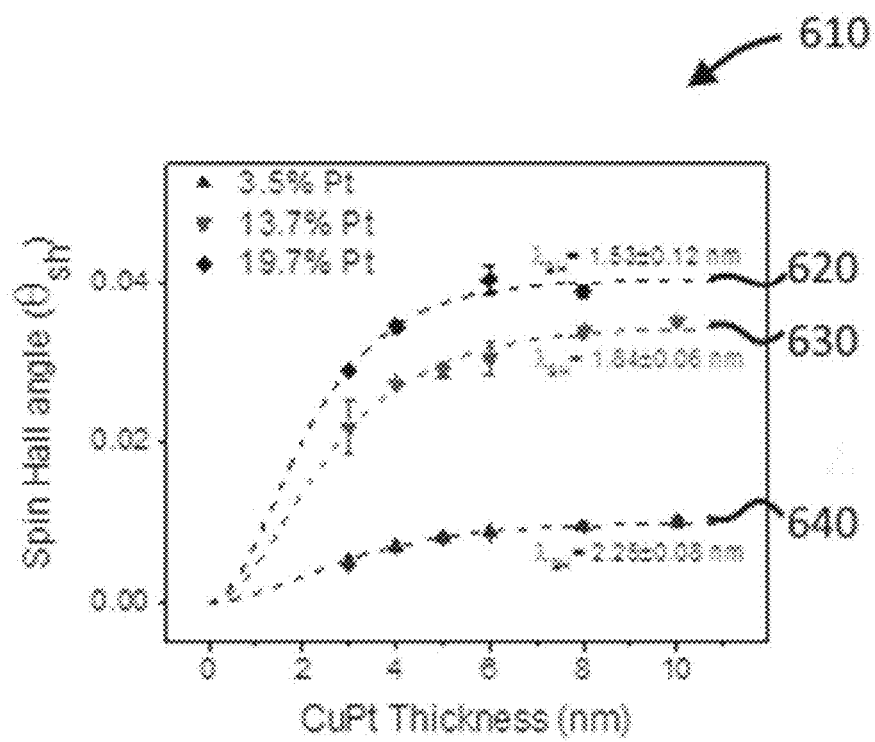
FIG. 6 is a plot of $\theta_{SH}$ as a function of $Cu_{1-x}Pt_x$ thickness for x=3.5, 13.7 and 19.7% in the example device shown in FIG. 3A.

FIG. 6 is a plot 610 of $\theta_{SH}$ as a function of $Cu_{1-x}Pt_x$ thickness for x=3.5, 13.7 and 19.7% in the example device shown in FIG. 3A. The dotted lines 620, 630, 640 indicate fitting for each composition. For each composition, the data may be fitted using the equation $\theta_{SH}(t)=\theta_{SH}^0 (1-\text{sech}(t/\lambda_{SH}))$,[5] to extract the intrinsic spin Hall angle, $\theta_{SH}^0$ and spin diffusion length, $\lambda_{SH}$.

F. Summary of CMOS Compatible Composite Alloy Techniques

To summarize, a SOT device may be constructed that replaces a traditional NM layer with a CMOS-compatible composite alloy (e.g., a Cu-based alloy such as CuPt alloy) NM layer. The CMOS-compatible alloy (e.g., CuPt alloy) may be highly efficient (e.g., as efficient as pure Pt) in terms of spin current generation efficiency, but with a smaller damping enhancement. The CMOS-compatible composite alloy may manipulate magnetization using SOTs. Further, the CMOS-compatible composite alloy may have properties that allow it to be readily integrated into CMOS processes. For example, in the case of a CuPt alloy, the alloy may withstand high annealing temperatures, and since Cu is a widely used metallization element in CMOS technology it may be readily integrated into CMOS processes.

III. A Topological Insulator NM Layer

A. Overview

In a second embodiment, a SOT device stack replaces a traditional NM layer with a topological insulator (TI) (e.g., $Bi_2Se_3$, $Bi_xSe_{1-x}$, $Bi_{1-x}Sb_x$, etc.) NM layer. A large SOT may be generated using a TI (e.g., $Bi_2Se_3$, $Bi_xSe_{1-x}$, $Bi_{1-x}Sb_x$, etc.) that may efficiently switch the magnetization of an adjacent FM layer with an extremely low $J_C$. For example, in this embodiment, a SOT device may be structured as a stack that includes, a substrate (e.g., $Al_2O_3$), a TI NM layer (e.g., having a thickness of 5-20 QL, where 1 QL is approximately equal to 1 nm), a FM layer (e.g., CoFeB or NiFe, having a thickness of 7 nm), a barrier layer of MgO (e.g., having a thickness of 2 nm), and a capping layer of $Al_2O_3$ (e.g., having a thickness of 3 nm). The TI layer may be grown on the substrate using molecular beam epitaxy (MBE) or sputtering. The CoFeB layer and insulating capping layer may be sputtered onto the TI layer. The deposited films may be patterned using optical photolithography and Ar ion milling, among other processes.

B. An Example Test Device

In a specific test device for which experimental results are presented herein, after the TI layer are grown on the substrate the CoFeB layer and insulating capping layer are sputtered onto the TI layer at room temperature, the stack is subsequently patterned into rectangular microstrips having a length of 130 µm and a width of 20 µm using optical photolithography and Ar ion milling. A CPW is fabricated using optical photolithography and sputter deposition to make electrical contacts with the microstrips. A gap (G) between ground and signal electrodes of the CPW is varied in the range 10-20 µm in order to tune the device impedance close to ~50Ω. ST-FMR measurement are conducted as discussed above in relation to the CMOS compatible composite alloy.

Figure 7A:
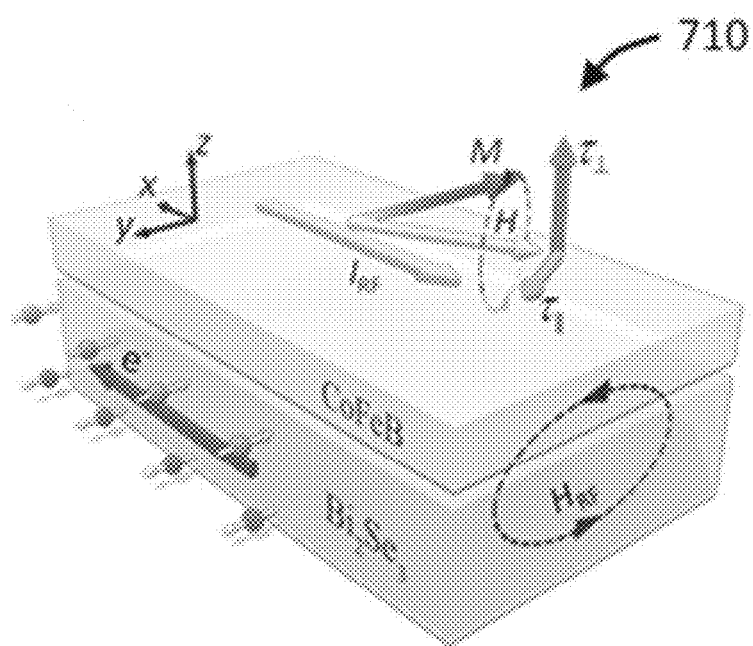
FIG. 7A is a diagram of spin momentum locking and SOT induced magnetization dynamics in ST-FMR measurements of a $Bi_2Se_3$/CoFeB bilayer in an example SOT device.
Figure 7B:
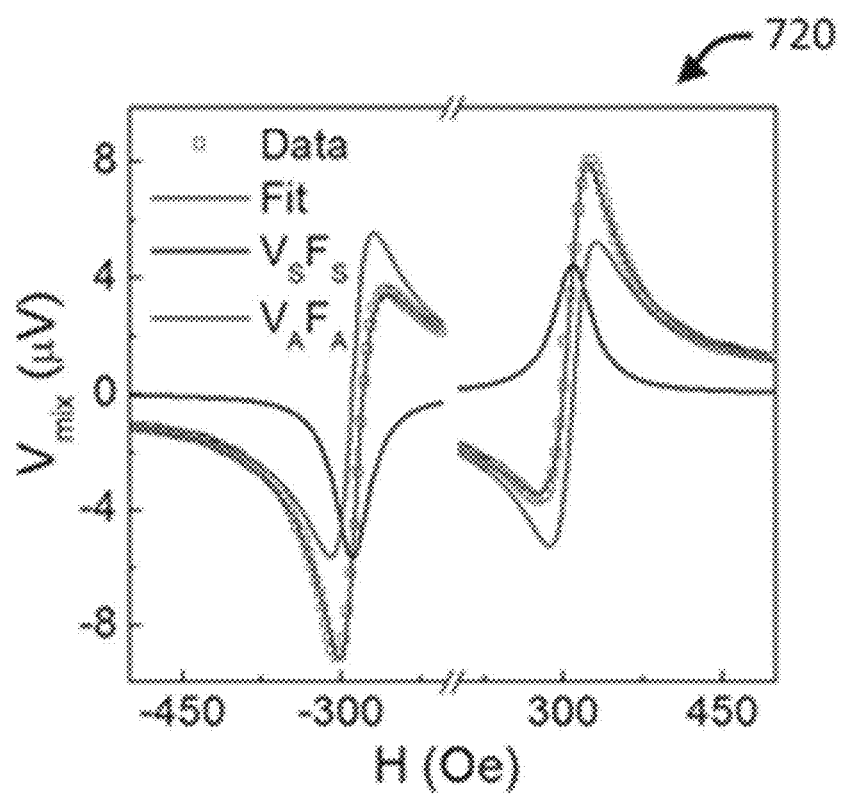
FIG. 7B is a plot of a ST-FMR signal obtained from a $Bi_2Se_3$/CoFeB bilayer of the example device shown in FIG. 7A.

FIG. 7A is a diagram 710 of spin momentum locking and SOT induced magnetization dynamics in ST-FMR measurements of a Bi$_2$Se$_3$/CoFeB bilayer of an example SOT device. FIG. 7B is a plot 720 of a ST-FMR signal obtained from a Bi$_2$Se$_3$/CoFeB bilayer of the example device at 6 GHz and a nominal microwave power of 15 dBm shown in FIG. 7A. The symmetric Lorentzian (V$_S$F$_S$) and antisymmetric Lorentzian (V$_A$F$_A$) components are shown. In this example, all the ST-FMR measurements are carried out at room temperature C. Extraction of Spin-Orbit Torque Efficiency and the Contribution from Interfaces As shown in FIG. 7B, amplitudes of symmetric (V$_S$) and antisymmetric (V$_A$) components can be obtained from the fits of the typical ST-FMR signal. Subsequently, the SOT efficiency $\theta_{TI}$ can be evaluated from only V$_S$ by the equations:

$$V_S = -\frac{I_{RF}\gamma\cos\theta_H}{4}\frac{dR}{d\theta_H}\tau_{DL}\frac{1}{\Delta}F_S(H),$$

$$\sigma_S = J_S/E = \tau_{DL}M_s t/E, \text{ and}$$

$$\theta_{TI} = J_S/J_C = \sigma_S/\sigma,$$

where I$_{RF}$ is the RF current flowing through the device, $\gamma$ is the gyromagnetic ratio, dR/d$\theta_H$ is the angular dependent magnetoresistance at $\theta_H$=35°, $\Delta$ is the linewidth of ST-FMR signal, F$_S$ (H) is a symmetric Lorentzian, H is in-plane external magnetic field, $\tau_{DL}$ is the damping-like spin-orbit torque on unit CoFeB moment at $\theta_H$=0°, M$_s$ is the saturation magnetization of CoFeB, t is the thickness of CoFeB, J$_S$ is the measured spin current density with in-plane spin polarizations at the Bi$_2$Se$_3$/CoFeB interface, which is correlated with the measured symmetric component V$_S$ as shown in FIG. 7B, J$_C$ (A cm$^{-2}$) is the uniform charge current density in the Bi$_2$Se$_3$ layer, $\sigma_S$ is the Bi$_2$Se$_3$ spin Hall conductivity, $\sigma$ is the Bi$_2$Se$_3$ conductivity, and E is the microwave field across the device.

Figure 8A:
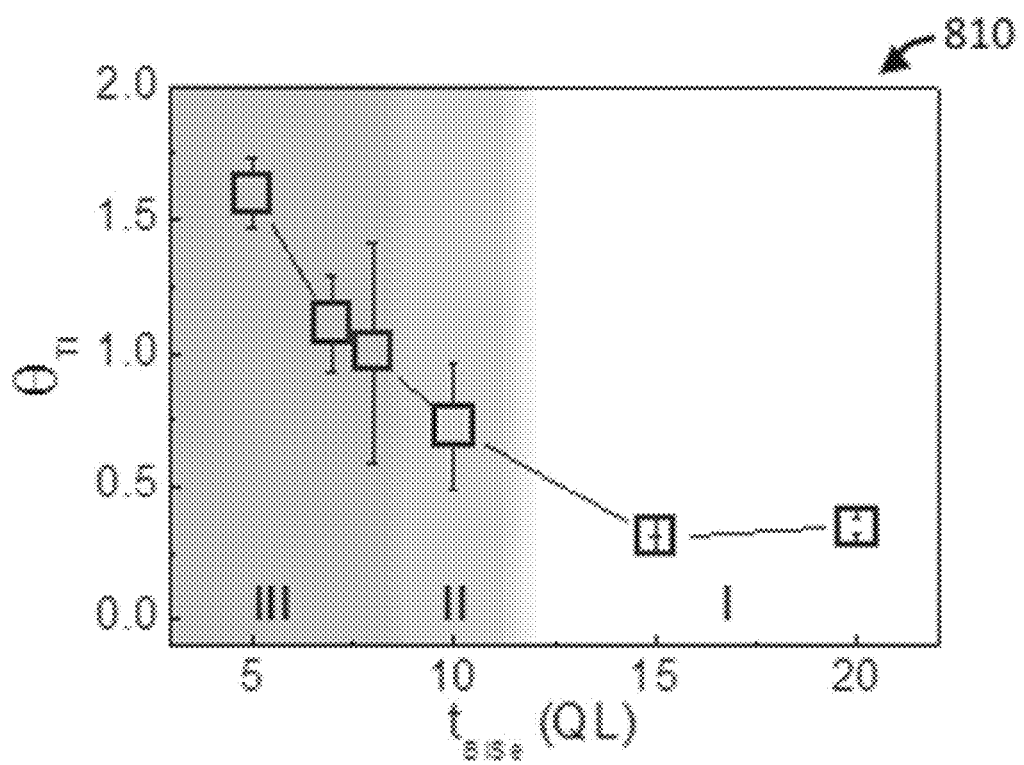
FIG. 8A is a plot of SOT efficiency ($\theta_{TI}$) as a function of $Bi_2Se_3$ thickness ($t_{BiSe}$) in the example device shown in FIG. 7A.

FIG. 8A is a plot 810 of SOT efficiency ($\theta_{TI}$) as a function of Bi$_2$Se$_3$ thickness (t$_{BiSe}$) in the example device shown in FIG. 7A. The data may be for room temperature. The error bars are the standard deviation. Region I, II and III denoted by different shading represent the charge-to-spin conversion dominated by different mechanisms. Each data point is averaged from three devices, which show a similar behavior. Specifically, $\theta_{TI}$ shows a constant value of approximately 0.3 for 15 and 20 QL devices, and starts to increase below 10 QL, reaching a maximum of ~1.75 at 5 QL. $\theta_{TI}$ in thinner films increases more than 5 times compared to that in thicker Bi$_2$Se$_3$ devices. From the line shape of the ST-FMR signals and the positive sign of $\theta_{TI}$ at different t$_{BiSe}$, it can be seen that the direction of in-plane spin polarization (S$_\parallel$) at the interface of Bi$_2$Se$_3$ and CoFeB is in line with TSS where S$_\parallel$ is locked at right angles to the electron momentum.

Since the thickness of a TSS (t$_{TSS}$) and two dimensional electron gas (2DEG) (t$_{2DEG}$) in Bi$_2$Se$_3$ are reported to be approximately 1 nm and approximately 4 nm, respectively, negligible bulk states (BS) are expected when the Bi$_2$Se$_3$ thickness is less than 8 QL. In region I (t$_{BiSe}$>10 QL), there are considerable BS and 2DEG contributions to the transport, which could dilute the TSS, resulting in a small $\theta_{TI}$. In region II (~10 QL), BS start to shrink, leading to a slight increase of $\theta_{TI}$. In region III (t$_{BiSe}$≤8 QL), the BS disappear and the contribution from the 2DEG decreases. On the other hand, due to the lack of inversion symmetry, Rashba splitting states in the 2DEG subbands can give rise to S$_\parallel$. However, the accumulated spins due to the Rashba states are expected to have an opposite helicity (i.e. negative $\theta_{TI}$) compared to the TSS. Since $\theta_{TI}$ always shows positive values, it may be concluded that the TSS dominated SOT is the main contribution to the large enhancement of $\theta_{TI}$ in region III.

The $\theta_{TI}$ versus t$_{BiSe}$ from ST-FMR measurements is obtained by using a uniform charge current density J$_C$ (A cm$^{-2}$) in the entire Bi$_2$Se$_3$ layer as $$\theta_{TI} = \frac{J_S}{J_C},$$

where J$_S$ is the spin currents. The interface SOT efficiency from only TSS, $\lambda_{TSS}$ (nm$^{-1}$), can be obtained by the interface charge current density J$_{C\text{-}TSS}$ (A cm$^{-1}$) in the TSS as $$\lambda_{TSS} = \frac{J_S}{J_{C\text{-}TSS}}.$$

Therefore, one may evaluate $\lambda_{TSS}$ by $$\lambda_{TSS} = \frac{n_{2D}/t_{BiSe}}{n_{TSS}}\theta_{TI},$$

where n$_{2D}$ and n$_{TSS}$ are the sheet carrier concentration in the entire Bi$_2$Se$_3$ film and TSS, respectively.

Figure 8B:
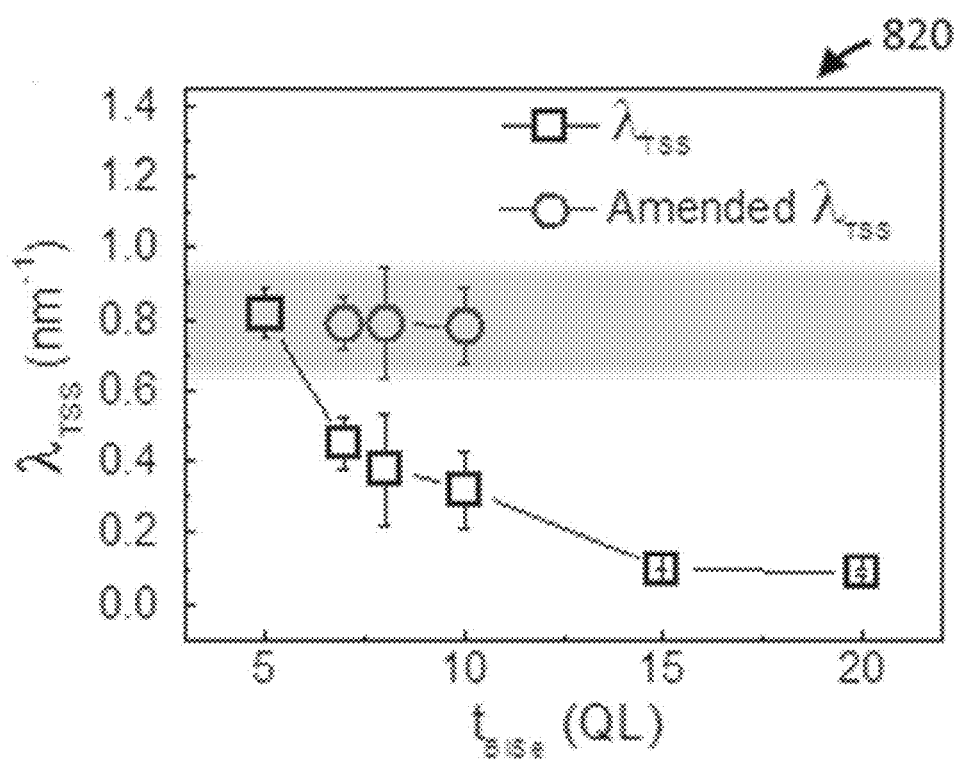
FIG. 8B is a plot of interface SOT efficiency, $\lambda_{TSS}$, as a function of $t_{BiSe}$ at room temperature in the example device shown in FIG. 7A.

FIG. 8B is a plot 820 of interface SOT efficiency, $\lambda_{TSS}$, as a function of t$_{BiSe}$ at room temperature in the example device shown in FIG. 7A. Amended interface SOT efficiency from TSS after excluding the opposite 2DEG contribution is also shown for 7, 8 and 10 QL Bi$_2$Se$_3$. The error bars are the standard deviation at each Bi$_2$Se$_3$ thickness. $\lambda_{TSS}$ is in the range of ~0.38-0.82 nm$^{-1}$ when t$_{BiSE}$≤8 QL at room temperature, which is consistent with recently reported interface SOT efficiency values in (Bi$_{1-x}$Sb$_x$)$_2$Te$_3$. Accordingly for t$_{BiSe}$≤8 QL, there are only TSS and 2DEG contribution to the SOT efficiency. In principle, $\lambda_{TSS}$ is inversely proportional to the Fermi velocity V$_F$ and remains almost constant at different t$_{BiSe}$, however a pronounced variation of $\lambda_{TSS}$ is observed. This deviation suggests that there is an opposite spin accumulation mechanism that cancels part of the spins generated by the TSS in Bi$_2$Se$_3$. This may be attributed to Rashba states in 2DEG. Based on this scenario, one may rewrite the $\lambda_{TSS}$ as:

$$\lambda_{TSS} = \frac{J_{S\text{-}TSS} - J_{S\text{-}2DEG}}{J_{C\text{-}TSS}} = \frac{J_{S\text{-}TSS}}{J_{C\text{-}TSS}} - \frac{J_{S\text{-}2DEG}}{J_{C\text{-}TSS}},$$

where J$_{S\text{-}TSS}$/J$_{C\text{-}TSS}$ is the intrinsic interface SOT efficiency from TSS ($\lambda_{intTss}$) which is inversely proportional to V$_F$ and almost remain constant at different t$_{BiSe}$, and J$_{S\text{-}2DEG}$ is the spin current density from Rashba splitting in 2DEG. This yields the equation:

$$\lambda_{TSS} = \lambda_{intriTSS} - \frac{\lambda_{2DEG}J_{C\text{-}2DEG}}{J_{C\text{-}TSS}},$$

where $\lambda_{2DEG}$ is the interface SOT efficiency from Rashba splitting in the 2DEG, $J_{C\text{-}2DEG}=n_{2DEG}$ µeE and $J_{C\text{-}TSS}=n_{TSS}$ µeE. One may assume that the difference of surface band bending between 7 and 8-QL Bi$_2$Se$_3$ films is small, which results in an almost constant $\lambda_{2DEG}$ By using the difference of $\lambda_{TSS}$ between 7 and 8 QL film, the $\lambda_{2DEG}$ is determined and it shows negative value and is ~−0.4 nm$^{-1}$. Moreover, the values for $\lambda_{intriTSS}$ are also estimated for $t_{BiSe} \leq 10$ QL with negligible BS. Interestingly, such that $\lambda_{intriTSS}$ shows a constant value of ~0.8 nm$^{-1}$ for 7, 8 and 10 QL Bi$_2$Se$_3$ films. This amended interface SOT efficiency is in the similar range of the value of $\lambda_{TSS}$ (~0.82 nm$^{-1}$) at $t_{BiSe}=5$ QL. This further indicates that TSS dominates SOT in thinner films and that there is high SOT efficiency from TSS.

D. SOT Driven Magnetization Switching in Bi$_2$Se$_3$/NiFe at Room Temperature

The SOT device also may be structured as a film stack that includes, for example, a TI NM layer (e.g., having a thickness of 8 QL where 1 QL is approximately equal to 1 nm) a FM layer of Nickel Iron (NiFe) Py (e.g., having a thickness of 6 nm), a barrier layer of MgO (e.g., having a thickness of 1 nm), and a capping layer of SiO$_2$ (e.g., having a thickness of 4 nm). The Py/MgO/SiO$_2$ layers may be sputtered onto the Bi$_2$Se$_3$ layer with an in-situ magnetic field along the y-axis (i.e. perpendicular to current channel). For testing purpose five 2-µm wide grooves may be etched on the Py layer and backfilled with nonmagnetic metal Cu, which divide the continuous Py layer into five rectangles and make them magnetically isolated. The magnetic easy axis of Py rectangles is along the ±y directions due to the shape anisotropy. This allows one to capture the magnetization switching after pulsed DC current is off, where there is no current induced spurious effects. The magnetization direction of Py is collinear with the incoming spin directions and thus the spins can directly switch the magnetization direction of Py without any external assisted magnetic field.

MOKE imaging measurements may be carried out on such an example device to observe SOT induced magnetization switching. FIGS. 9A-J are a series of MOKE images for SOT driven magnetization switching. FIGS. 9A-E show a pulsed DC current I along the +x-axis. FIGS. 9F-J show pulsed DC current I along the −x-axis. In both cases increasing $J_C$ in the Bi$_2$Se$_3$ layer is denoted underneath the corresponding image.

More specifically, the initially Py magnetization is saturated along the +y-axis by applying an in-plane external magnetic field (H). Then in the testing H is removed and I is applied along the +x-axis to the device. When the current density in Bi$_2$Se$_3$ is zero, the MOKE image as shown in FIG. 9A is captured. The dark contrast represents the magnetization along the +y-axis, indicated by the arrow. As $J_C$ increases, the area of the switched magnetization with light contrast gradually expands as shown in FIGS. 9B-D. Finally, the magnetization of all Py rectangles is switched to the −y-axis at $J_C=5.7\times10^5$ A cm$^{-2}$, which is indicated by the arrow in FIG. 9E. Similarly, for the other set of tests in FIG. 9F-J, the Py magnetization is initialized along the −y-axis. Then in the testing H is removed and I is applied with opposite polarity, i.e., along the −x-axis. As $J_C$ increases, the Py magnetization switches from the −y, as shown in the light contrast of FIG. 9F, to +y-axis, as shown in the dark contrast of FIG. 9J, at $J_C=6.2\times10^5$ A cm$^{-2}$, exhibiting the opposite switching direction. The SOT induced switching is reproducible in other devices. The current density required for the room temperature SOT induced magnetization switching in the Bi$_2$Se$_3$/Py is extremely low at ~6×10$^5$ A cm$^2$, which is one to two orders of magnitude smaller than that with heavy metals.

Moreover, based on the antidamping spin torque driven magnetization switching model with consideration of thermal fluctuation and reverse domain nucleation, the SOT efficiency of Bi$_2$Se$_3$ from SOT induced magnetization switching is determined. For antidamping spin torque driven magnetization switching, the critical switching current density $f_{C0}$ for the switching scheme of our Bi$_2$Se$_3$/Py device can be described by:

$$J_{C0} = \frac{2e}{\hbar}\mu_0 M_s t\alpha(H_c + M_{eff}/2)/\theta_{TI},$$

where $J_{C0}$ is the critical switching current density without thermal fluctuation, $M_s$, t, α, $H_c$ and $M_{eff}$ are the saturated magnetization, thickness, damping constant, coercive field and effective magnetization of Py layer, respectively, and $\theta_{TI}$ is the SOT efficiency. This equation is based on the macrospin model in the absence of thermal fluctuation. The magnetization switching process can be described by the localized nucleation of reverse domains with an activation volume $V_N$ first, followed by domain wall propagation. Magnetization exhibits coherent reversal inside the activation volume $V_N$. Therefore, the equation can be applied by introducing $V_N$ instead of the whole volume of Py layer. In testing, the switching current density $J_C$ for the magnetization switching is ~6.2×10$^5$ A m$^{-2}$ at room temperature. Then the $J_{C0}$ can be obtained by $$\frac{J_C}{J_{C0}} = 1 - \frac{K_B T}{K_{Py} V_N}\ln\frac{t_P}{t_0}$$

with thermal fluctuation considerations, where $t_p$ is the current pulse width of approximately 500 µs, $t_0$ is the attempt time of approximately 1 ns, the anisotropy energy density $K_{Py}$ is estimated by $H_c M_s/2$ with measured $H_c$ approximately 6.9 Oe and $M_s=6.84\pm0.03\times10^5$ A m$^{-1}$. The domain wall width $\delta_m$ of Py layer is assumed to be approximately 220 nm, and t is 6 nm, then we can estimate $V_N \approx \delta_m^2 t$. Consequently, $J_{C0}$ may be approximately 5.26×$J_C$. The $M_{eff}$ and α may be ~0.57 T and ~0.01543, respectively based on experimental measurements. Further, based on experimental testing SOT efficiency $\theta_{TI}$ for Bi$_2$Se$_3$/Py may be approximately 1.71. This value is consistent with the value obtained from ST-FMR measurements ($\theta_{TI}$~1). This agreement further indicates the excellent efficiency of TIs in spin generation and SOT driven magnetization switching.

F. Summary of Topological Insulator Techniques

To summarize, a SOT device may be constructed that replaces a traditional NM layer with a TI (e.g., Bi$_2$Se$_3$, Bi$_x$Se$_{1-x}$, Bi$_{1-x}$Sb$_x$, etc.) NM layer. Such TI NM layer may be a highly efficient spin current generator. In the case of a device that uses a Bi$_2$Se$_3$ TI NM layer (as discussed above), the Bi$_2$Se$_3$ layer may, for example, exhibit a SOT efficiency up to approximately 1.75 at room temperature, which corresponds to an interface SOT efficiency of $\lambda_{TSS}=0.8$ nm$^{-1}$. The SOT induced magnetization switching may be successfully achieved at room temperature without any external magnetic field. The current density required for the magnetization switching in a SOT device employing a TI NM layer may be extremely low. For example, in the case of an example device that uses a Bi$_2$Se$_3$ TI NM layer (as discussed above), current density may be approximate $6 \times 10^5$ A/cm$^2$ which is almost two orders of magnitude smaller than that in heavy metals. Utilizing a TI NM layer, a device may achieve very low power consumption, addressing scalability issues in modern magnetic devices. Furthermore, as an assistive magnetic field may not be required, a TI NM layer may be readily integrated into existing technologies for magnetic devices.

VI. A TI/Non-Magnetic Metal Interface NM Layer

A. Overview

In a third embodiment, a SOT device stack replaces a traditional NM layer with a TI/non-magnetic metal interface (e.g., a Bi$_2$Se$_3$/Ag, Bi$_x$Se$_{1-x}$/Ag, Bi$_{1-x}$Sb$_x$/Ag, etc. interface) layer adjacent to the FM layer. A TI/non-magnetic metal interface (e.g., Bi$_2$Se$_3$/Ag interface) Rashba effect can induce efficient charge-spin conversion. This Rashba interface may serve as a spin current source to achieve TI-based room temperature spin devices with high scalability and efficiency. For example, in one embodiment, a SOT device may be structured as a film stack that includes a substrate made of Al$_2$O$_3$, a Bi$_2$Se$_3$/Ag interface layer (e.g., having a Bi$_2$Se$_3$ thickness of 10 QL where 1 QL is approximately equal to 1 nm, and an Ag thickness ($t_{Ag}$) up to 5 nm), a FM layer of Co$_{40}$Fe$_{40}$B$_{20}$ (e.g., having a thickness of 7 nm), a barrier layer of MgO (e.g., having a thickness of 2 nm), and a capping layer of SiO$_2$ (e.g., having a thickness of 4 nm).

B. An Example Test Device and In-Plane Torque/Out-of-Plane Torque Ratio

Figure 10:
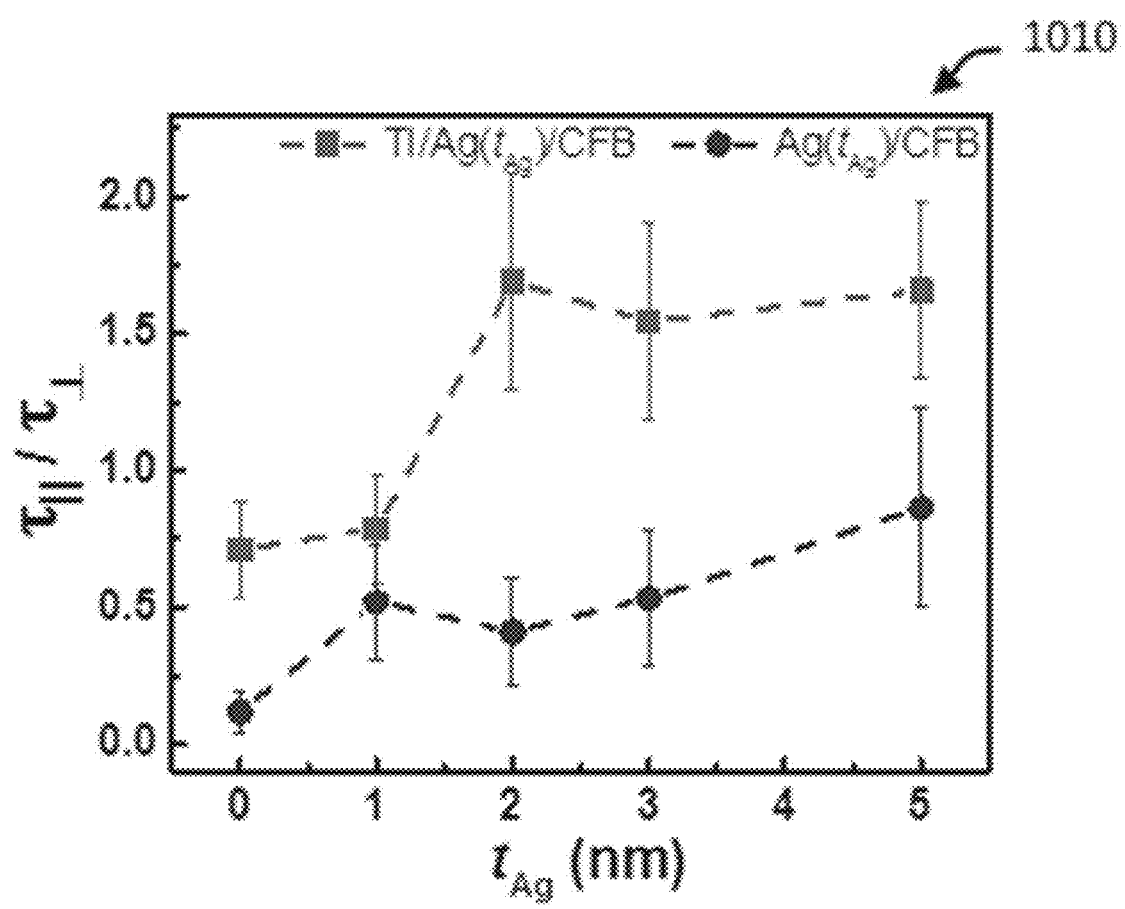
FIG. 10 is a plot of $\tau_\parallel/\tau_\perp$ ratio for an example SOT device with a TI/non-magnetic metal interface (e.g., $Bi_2Se_3$/Ag) and different $t_{Ag}$.

In a specific test device for which experimental results are presented herein, samples are prepared as discussed above with $t_{Ag}$=0, 1, 2, 3, 5 nm. FIG. 10 is a plot 1010 of the $\tau_{\parallel}/\tau_{\perp}$ ratio for example SOT devices with a TI/non-magnetic metal interface (e.g., Bi$_2$Se$_3$/Ag) at different Ag thicknesses. In such devices, the in-plane torque/out-of-plane torque ratio ($\tau_{\parallel}/\tau_{\perp}$) varies for different Ag thicknesses. The $\tau_{\parallel}/\tau_{\perp}$ ratio shows an increasing trend first and then saturating behavior with increasing the Ag thickness for Bi$_2$Se$_3$/Ag/CoFeB samples. However, without TI/Ag interfaces, the $\tau_{\parallel}/\tau_{\perp}$ ratio of Ag/CoFeB control samples show a mild increment as $t_{Ag}$ becomes thicker. More specifically, for Bi$_2$Se$_3$/Ag (t nm)/CoFeB samples, the $\tau_{\parallel}/\tau_{\perp}$ value changes from 0.7 (in Bi$_2$Se$_3$/CoFeB) to 1.7 (in Bi$_2$Se$_3$/Ag(2 nm)/CoFeB). A peak value appears at $t_{Ag}$=2 nm, followed by a stabilizing behavior at $t_{Ag}$ greater than 2 nm suggests that the Bi$_2$Se$_3$/Ag interface effect saturates above approximately 2 nm Ag. This $\tau_{\parallel}/\tau_{\perp}$ ratio evolution feature is similar with the $\tau_{\parallel}/\tau_{\perp}$ ratio measured in a Bi/Ag (t nm) interfacial Rashba system, indicating that the Bi$_2$Se$_3$/Ag interface effect can be attributed to the Rashba effect.

C. Extraction of the Charge-Spin Conversion Efficiency

Using techniques as discussed above in reference to the second embodiment, one may extract the charge-to-spin conversion efficiency in both Bi$_2$Se$_3$/Ag/CoFeB devices and Ag/CoFeB devices. To evaluate the spin orbit torque ratio ($\theta_{\parallel}$), one may assume that the charge conductivity of the Bi$_2$Se$_3$/Ag is no more than the conductivity for the Bi$_2$Se$_3$ single layer capped with 2 nm of MgO and 4 nm of SiO$_2$, which is ~$6.99 \times 10^4$ $\Omega^{-1}$m$^{-1}$ from probe measurements. This value is comparable with the value obtained in Bi$_2$Se$_3$ with a Al$_2$O$_3$ cap. With this assumption, one may obtain a lower bound of $\theta_{\parallel}$ in Bi$_2$Se$_3$/Ag/CoFeB.

Figure 11:
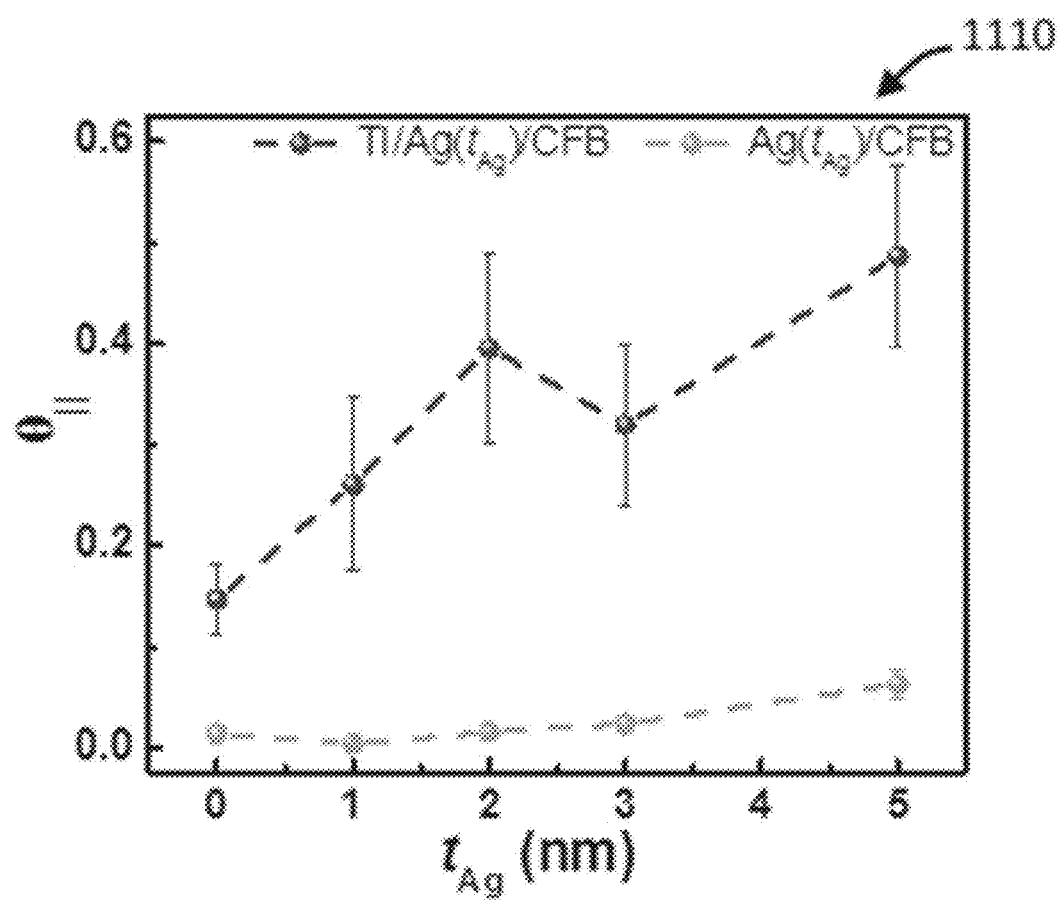
FIG. 11 is a plot of spin-orbit toque efficiency ($\theta_\parallel$) for example $Bi_2Se_3$/Ag/CoFeB devices and the Ag/CoFeB devices.

FIG. 11 is a plot 1110 of spin-orbit toque efficiency ($\theta_{\parallel}$) for example Bi$_2$Se$_3$/Ag/CoFeB devices and the Ag/CoFeB devices. For this data, in the Bi$_2$Se$_3$/Ag/CoFeB devices the Bi$_2$Se$_3$ has a thickness of 10 QL, the Ag has a thickness of $t_{Ag}$, and the CoFeB has a thickness of 7 nm, and in the Ag/CoFeB devices the Ag has a thickness of $t_{Ag}$ and the CoFeB has a thickness of 7 nm. As shown in FIG. 11, $\theta_{\parallel}$ is significantly improved with inserting the Bi$_2$Se$_3$/Ag interface. Notably, for the Bi$_2$Se$_3$/Ag/CoFeB devices, the lower bound of $\theta_{\parallel}$ is approximately 0.5 while the maximum $\theta_{\parallel}$ for Bi$_2$Se$_3$/CoFeB devices is no more than 0.1. As a comparison, the $\theta_{\parallel}$ for the Ag/CoFeB devices may be negligibly small, indicating the large spin orbit torque ratio of approximately 0.5 obtained in the Bi$_2$Se$_3$/Ag/CoFeB devices is not related to the SHE of Ag.

Figure 12A:
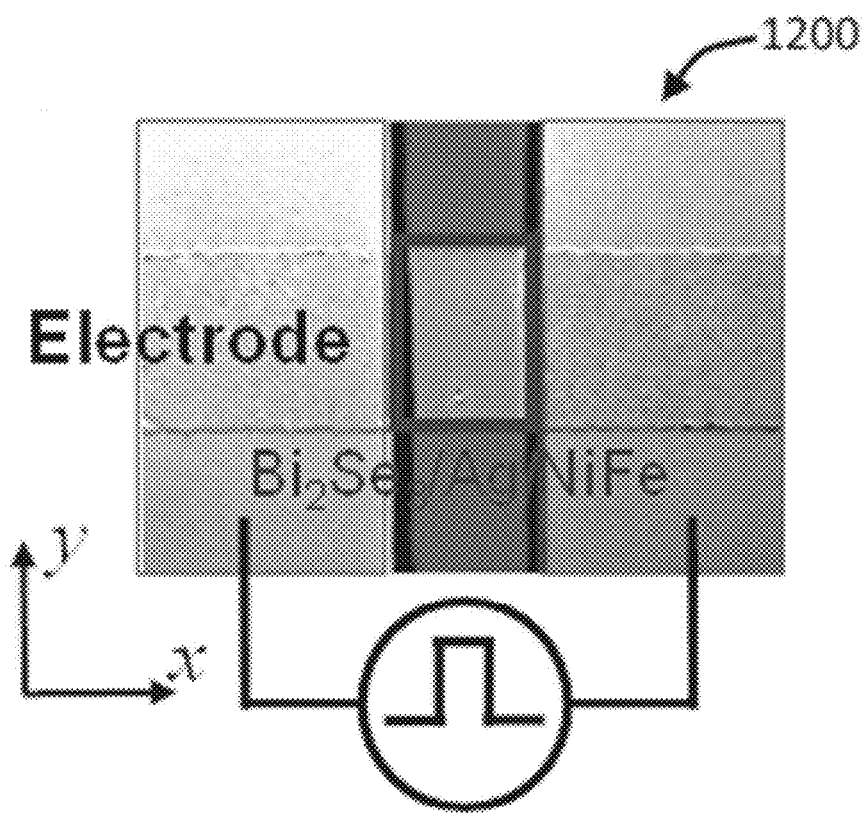
FIGS. 12A-E are a series of MOKE images for SOT driven magnetization switching in an example TI/nonmagnetic metal/FM device.
Figure 12B:
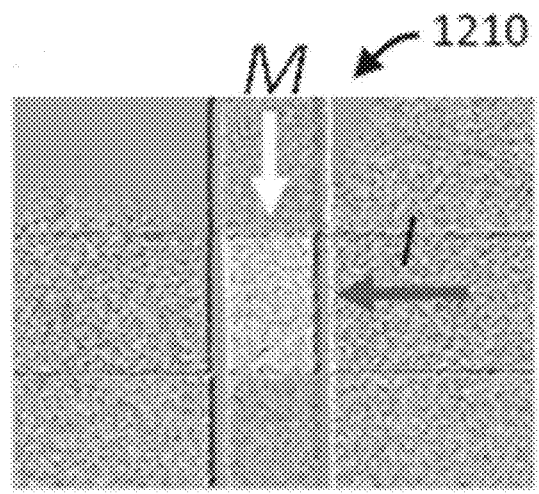
Figure 12C:
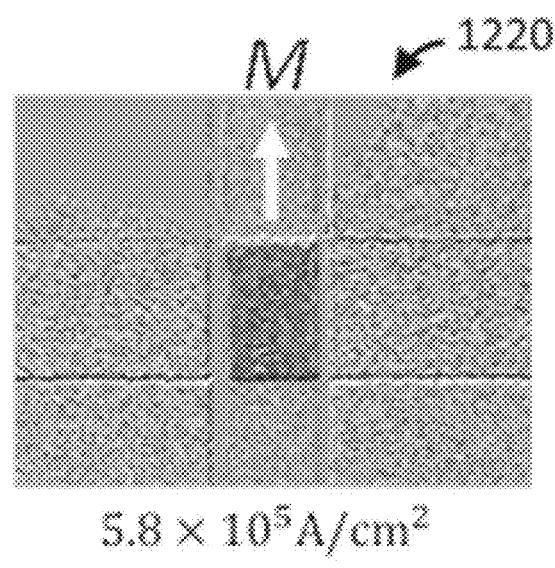
Figure 12D:
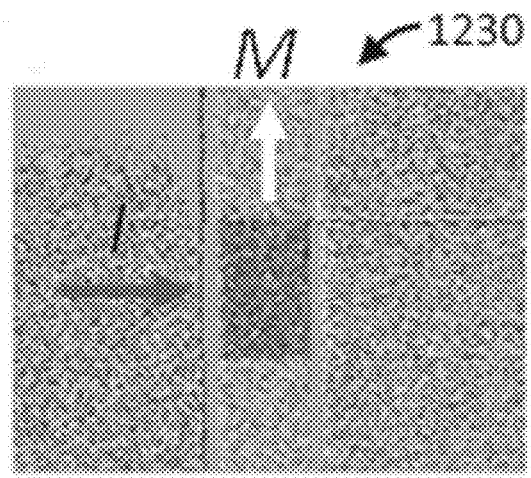
Figure 12E:
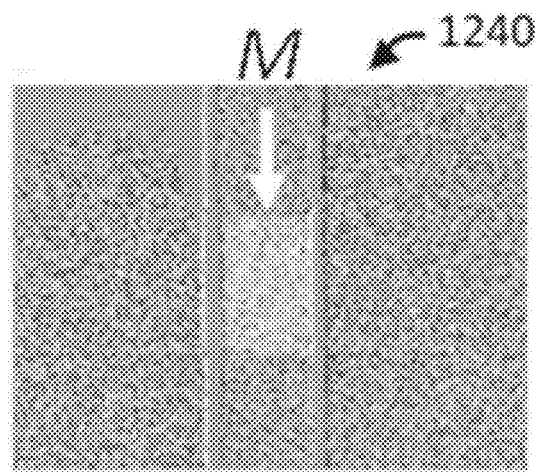

D. Rashba Effect Driven Magnetization Switching in Bi$_2$Se$_3$/Ag/NiFe at Room Temperature The interfacial Rashba effect driven magnetization switching at room temperature in an example Bi$_2$Se$_3$ (10 QL)/Ag (2 nm)/NiFe (6 nm) sample is demonstrated by MOKE microscopy. FIG. 12A is a microscopic picture 1200 of the device, showing a 15-μm-wide Bi$_2$Se$_3$/Ag/NiFe channel connected by two electrodes. FIGS. 12B and 12C are images 1210, 1220 that demonstrate the switching of NiFe magnetization from down (light) to up (dark) by applying a current density of $5.8 \times 10$ A/cm$^2$. FIGS. 12D and 12E are images 1230, 1240 that show the switching back of NiFe magnetization from up to down by an opposite current pulse. It is observed that Bi$_2$Se$_3$/Ag/NiFe can reduce the switching current density down to ~$5.8 \times 10$ A/cm$^2$, which is about two orders of magnitude smaller than that in conventional heavy metal/ferromagnetic bilayers.

E. Summary of TI/Non-Magnetic Metal Interface Techniques

To summarize, a SOT device may be constructed that replaces a traditional NM with a TI/non-magnetic metal interface (e.g., a Bi$_2$Se$_3$/Ag, Bi$_x$Se$_{1-x}$/Ag, Bi$_{1-x}$Sb$_x$/Ag, etc. interface) layer adjacent to the FM layer. This interface may exhibit efficient charge-to-spin current conversion process originating from the interface Rashba effect. Such a process may be dependent on the thickness of the non-magnetic metal. In the case of a Bi$_2$Se$_3$/Ag interface the Rashba induced charge-to-spin conversion may be Ag-thickness dependence, in a specific example (as discussed above) saturating at $t_{Ag}$ approximately equals 2 nm. High charge-spin conversion efficiency may be achieved. In the case of an example Bi$_2$Se$_3$/Ag/CoFeB device (as discussed above) a value of spin orbit torque ratio of approximately 0.5 may be achieved at room temperature. This charge-spin conversion efficiency may be further increased by improving the interface quality. The Rashba effect induced magnetization switching may be successfully achieved at room temperature without any external magnetic field. The current density required for the magnetization switching in a SOT device employing a TI/nonmagnetic metal interface (e.g., Bi$_2$Se$_3$/Ag) may be extremely low.

V. Further Alternatives

It should be understood that various adaptations and modifications may be made to the above-discussed techniques. For example, while it is discussed above that the various metal and oxide layers (such as the CMOS-compatible composite alloy layer) may be deposited using magnetron sputtering, it should be understood that a variety of other metal and oxide growth techniques may be utilized. Likewise, while it is discussed above that MBE may be used to grow a TI layer, it should be understood that a variety of other TI growth techniques may be utilized. In addition, while a number of example layers of device stack are discussed, it should be understood that additional or different layers, interfaces or junctions may be employed. For instance, in embodiments utilizing a TI or TI/non-magnetic metal interface, a magnetic functional part on top of the TI or TI/non-magnetic metal interface can also be magnetic tunnel junctions (MTJ) composed of any of a variety of materials. The MTJ may have a traditional sandwiched structure. The MTJ can also have a synthetic antiferromagnetic (SAF) or single antiferromagnetic exchange biased free magnetic layer and a SAF or single antiferromagnetic pinned reference magnetic layer.

In general, it should be appreciated that details included in the various example embodiments are merely provided for purposes of illustration, and are not intended to limit the scope, applicability, or configuration of the invention. For example, it should be understood that the various elements described above may be made from differing materials, implemented in different combinations or otherwise formed or used differently without departing from the intended scope of the invention. What is claimed is:

The invention claimed is:

1. A spin-orbit torque (SOT) device, the SOT device comprising:
 a magnetic layer; and
 a non-magnetic layer (NM) layer adjacent to the magnetic layer that is configured to generate spin current that diffuses into the magnetic layer, the NM layer including
   a complementary metal oxide semiconductor (CMOS)-compatible composite alloy that includes nonmagnetic impurities added to a CMOS-compatible metal host and is configured to generate the spin current via an extrinsic spin Hall effect (SHE) involving electron scattering on centers of the nonmagnetic impurities,
   a topological insulator (TI) configured to generate the spin current via topological protected spin-momentum-locked surface states (TSS), or
   a TT/non-magnetic metal interface configured to generate the spin current via Rashba effect.

2. The SOT device of claim 1, wherein the NM layer includes the CMOS-compatible alloy.

3. The SOT device of claim 1, wherein the nonmagnetic impurities are Pt and the CMOS-compatible metal host is Cu, and the CMOS-compatible alloy is CuPt alloy.

4. The SOT device of claim 1, wherein the NM layer includes the TI.

5. The SOT device of claim 4, wherein the TI is $Bi_2Se_3$, $Bi_xSe_{1-x}$, or $Bi_{1-x}Sb_x$.

6. The SOT device of claim 1, wherein the NM layer includes the TT/non-magnetic metal interface.

7. The SOT device of claim 6, wherein the TT/non-magnetic metal interface is a $Bi_2Se_3$/Ag, $Bi_xSe_{1-x}$/Ag, or $Bi_{1-x}Sb_x$/Ag interface.

8. The SOT device of claim 1, wherein the SOT device is a magnetic random access memory (MRAM), magnetic logic device or racetrack memory.

* * * * *